United States Patent [19]

Kagawa et al.

[11] 4,415,370
[45] Nov. 15, 1983

[54] METHOD OF BERYLLIUM IMPLANTATION IN GERMANIUM SUBSTRATE

[75] Inventors: Shuzo Kagawa, Kawasaki; Tatsunori Shirai, Yokohama; Takao Kaneda; Yasuo Baba, both of Kawasaki, all of Japan

[73] Assignee: Fujitsu Limited, Kawasaki, Japan

[21] Appl. No.: 187,419

[22] Filed: Sep. 15, 1980

[51] Int. Cl.$^3$ ............................................. H01L 21/263
[52] U.S. Cl. ................................. 148/1.5; 148/172; 148/187; 357/61; 357/63; 357/91
[58] Field of Search ................ 148/1.5, 187, 172; 357/61, 63, 91

[56] References Cited

U.S. PATENT DOCUMENTS 4,235,651 11/1980 Kamath et al. ..................... 148/171

OTHER PUBLICATIONS

Diffusion in Solids, B. L. Sharma, Tran-Tech, Clausthal-Zellerfeld, W. Germany, pp. 106–107, 88–89.
Axman et al., Appl. Physics, vol. 12, (1977), 173–178.
Björkquist et al., Radiation Effects 6, (1970), 141–148.

*Primary Examiner*—Upendra Roy
*Attorney, Agent, or Firm*—Staas & Halsey

[57] ABSTRACT

A semiconductor device, and a method for manufacturing it in which ions of beryllium are implanted into a germanium substrate to form a layer containing p-type impurity material. There after the substrate is heated at a temperature in the range of 400° C. to 700° C. to diffuse the beryllium ions into the substrate so that the concentration of beryllium at the surface of the impurity layer is in the order of $10^{17} cm^{-3}$ or more. In one embodiment, a p-type channel stopper is formed locally in a p-type germanium substrate and an n-type active layer is formed in a region surrounded by, and isolated from, the channel stopper region. In another embodiment, a relatively shallow p-type active layer is formed at one part of an n-type germanium substrate and p-type guard ring regions are formed surrounding, and partly overlapping said p-type active layer. In a further embodiment, a p-type island region is formed at one part of an n-type germanium substrate, and an n-type region is formed within said p-type region. In these embodiments, the p-type channel stopper region, p-type guard ring regions and the p-type island region are all formed by implanting ions of beryllium into the germanium substrate.

14 Claims, 25 Drawing Figures

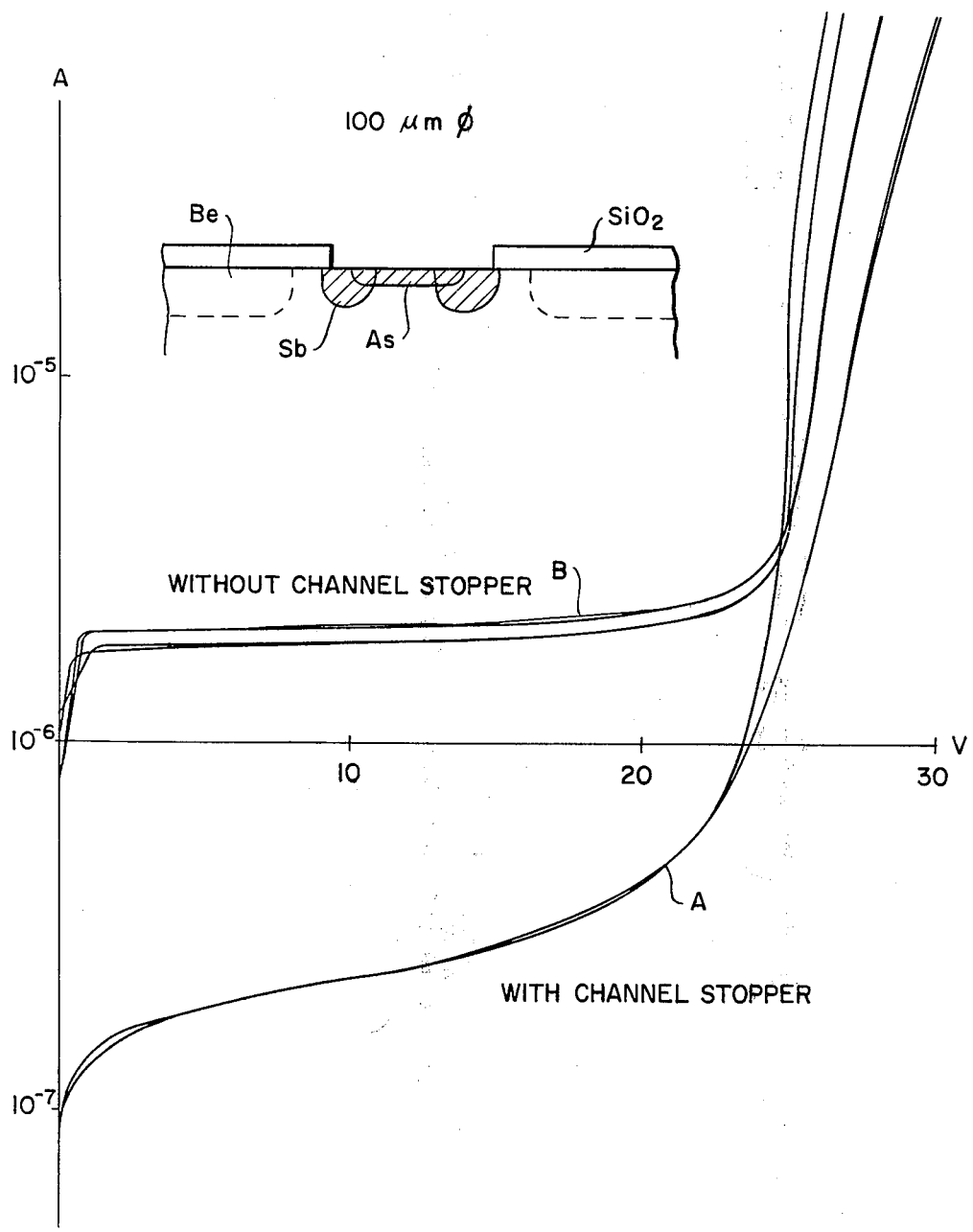

METHOD OF BERYLLIUM IMPLANTATION IN GERMANIUM SUBSTRATE

BACKGROUND OF THE INVENTION

This invention is directed to a method of manufacturing a semiconductor device, and more particularly to a method of manufacturing of a semiconductor device which is characterized by a process wherein a p-type impurity layer is diffused by implantation of beryllium (Be) ions into a germanium (Ge) substrate.

In the art to which this invention pertains, it is generally known and practiced to introduce p-type dopants, such as boron (B), indium (In) or zinc (Zn), into a semiconductor wafer which already has a background concentration of n-type impurities. In the case of diffusion of boron, for example, its diffusion coefficient is relatively small, so that a subsequent heat treatment at a high temperature for a long period of time is necessary in order to obtain a deep lying diffusion. The heat treatment of the kind just described can bring about adverse effects in the semiconductor water. One such effect is a deficiency of crystal structure at the interface of an insulating film (such as a silicon dioxide film partially formed on the surface of a germanium substrate for masking the impurity) and the bulk of the germanium. There can also be thermal deformation of the whole germanium wafer. Both results are due to the difference between the thermal expansion coefficients of the insulating film and the bulk.

In the manufacture of an avalanche photodiode (APD), it is also generally known and practiced to form guard rings to improve breakdown voltage characteristics. In other words, it is required to obtain a substantial diffusion depth and a graded p-n junction to maintain sufficient withstand voltage characteristics at the p-n junction where light is irradiated. As pointed out above, boron can only be diffused shallow and the resulting p-n junction is more like an abrupt step junction. And thus, efforts have been made to find a p-type impurity material which can be diffused sufficiently deep into a germanium substrate to produce a graded junction and which exhibits high withstand voltage characteristics.

Historically silicon was used from the beginning to make a photodiode in the field of light communication systems using optical fibers. Originally, a 0.8 $\mu$m band was enough for the purpose of light communication systems. As the wavelength of light used in such communication became more than 1.0 $\mu$m for reducing the transmission loss in the fiber, it was found that silicon was unable to respond adequately thereto, whereas germanium responds well to light having a wavelength in range of 1.5 $\mu$m. And thus, the utility of germanium in the field of light communication drew attention of the researchers in the art. However, it was generally believed that the established technique for manufacturing a silicon photodiode could not be applied to germanium because, whereas p-type layers can easily be formed into the silicon bulk by diffusion of boron, boron could not be used to diffuse deeply enough to form p-type layers in a germanium bulk.

It has been known that beryllium, when diffused into germanium at high temperature, forms a p-type layer. However, since its oxide is toxic, its utility as a p-type dopant was not considered in practice. For example, Diffusion in Semiconductors by B. L. Sharma, Trans Tech Publication of Clausthal-Zellerfeld, Germany reports, at P. 107, that solid solubility of beryllium in germanium is $4 \times 10^{16}$ cm$^{-3}$ at a maximum temperature of 920° C. The same literature also presents at P. 89 that the diffusion coefficient of beryllium is $8.9 \times 10^{-13}$ cm$^2$/sec., a value substantially equal to that of zinc or boron. This tended to divert the attention of the researchers in this art away from utilizing beryllium as a p-type diffusant for germanium. The general trend was to seek a suitable p=type diffusant in group III of the periodic table, and n-type dopant in group V. Although Zn is in group II, researchers neglected to look into elements in group II in their efforts to find a suitable p-type dopant to be diffused into germanium because of the lengthy heat treatment at high temperatures necessary with zinc.

SUMMARY OF THE INVENTION

The present invention originates from an appraisal of beryllium as a p-type dopant in relation to germanium, and experiments were conducted to implant ions of beryllium into the bulk of germanium. Study of the impurity profile obtained with beryllium disclosed, quite contrary to the old belief, that the profile obtained by the implantation of beryllium ions was different from the profiles of known impurities. The profile of boron impurities for example in the germanium bulk is like a plateau where impurity concentration is high, and where the impurity concentration is traced at different distances from the surface of the germanium bulk. As illustrated in FIG. 1, it was found that a curve obtained by such tracing drops down suddenly where the concentration of boron is low. However, in the case of beryllium, a curve obtained by tracing the values of concentration against the distance from the surface of germanium bulk, falls down gradually where the concentration is low, as will be described in more detail hereafter. When the ion implantation technique for beryllium is used, a much deeper diffusion layer was found to exist, compared to the diffusion depth of boron in the order of 0.6 $\mu$m. A germanium wafer was heat treated at 640° C. for one hour after the beryllium ion implantation described above, and the diffusion depth in the order of 10 $\mu$m was observed. Furthermore, it was found through experiments that heat in the range of 400° C. is sufficient to activate beryllim at or near the surface of germanium bulk. In addition, the practical maximum concentration of active berylium atoms into the germanium bulk was found to be much higher than $10^{17}$ cm$^{-3}$, in contrast to the solid solubility of $4 \times 10^{16}$ cm$^{-3}$ as taught by the cited literature.

A germanium bulk into which a p-type diffusion layer has been formed by implantation of beryllium ions and subsequent heat treatment was found an especially suitable device for an avalanche photodiode.

Taking an extrinsic pn-junction silicon photodiode as an example, when photons having an energy larger than that of the silicon energy gap are absorbed in the device, hole-electron pairs are generated as is generally known. The depletion region is substantially void of free current carriers, so that a main electric field exists within the depletion region. Hole-electron pairs induced by photons are separated and drawn out by the depletion region equivalent voltage and the reverse bias applied to generate photocurrent with an avalanche multiplication effect.

In an avalanche photodiode of the kind described above, one of the technical problems has been to reduce noise and dark current which is mainly caused by diffusion of minority carriers generated near the p-n junction toward the depletion region. In order to minimize the dark current, n-type channel stoppers and/or islands were formed to the bulk of the silicon substrate to restrict the diffusion of minority carriers to the depletion region. According to the present invention, p-type channel stoppers and/or islands were formed in the bulk of the germanium substrate for the same purpose, and the method of ion implantation of beryllium into the germanium as explained before was found to be effective in obtaining sufficiently deep diffusion of beryllium which suppresses dark current substantially.

It is therefore a general object of the present invention to offer a method of manufacturing a semiconductor device wherein ions of berylium are implanted into the bulk of a germanium substrate in order to form a deep lying p-type impurity layer in said substrate at a temperature which will suppress dark current or improve breakdown voltage characteristics.

It is another object of this invention to present a method of manufacturing a semiconductor device wherein said germanium substrate to which ions of beryllium have been implanted is heated at a temperature higher than 400° C. but lower than 700° C. to allow beryllium in the germanium substrate to be diffused into the bulk thereof.

It is yet another object of the invention to propose a method of implantation of beryllium ions into a germanium substrate wherein concentration of beryllium at the surface of the germanium substrate is higher than $10^{17}$ cm$^{-3}$.

It is a further object of the invention to form p-type channel stopper regions by implanting ions of beryllium into a germanium substrate in a method of manufacturing a semiconductor device wherein p-type channel stopper regions are selectively formed and an n-type active region which is isolated from the channel stopper regions is made in the bulk of the substrate surrounded by the channel stopper regions.

It is yet a further object of the invention to form p-type guard ring regions by ion implantation of beryllium into a germanium substrate in a method of manufacturing a semiconductor device wherein a relatively shallow p-type active region is formed at one part of an n-type germanium substrate and p-type guard ring regions are formed in the periphery of the p-type active region in such a manner that the guard ring regions overlap the p-type active region.

It is yet another object of the invention to form a p-type region by implanting ions of beryllium into a germanium substrate in a method of manufacturing a semiconductor substrate wherein a p-type region is formed at one part of an n-type germanium substrate, and an n-type region is formed within the p-type region.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

FIG. 5G is a graphic illustration of dark currents in the germanium substrate with and without channel stopper regions respectively.

DESCRIPTION OF THE PREFERRED EMBODIMENT

Figure 1:
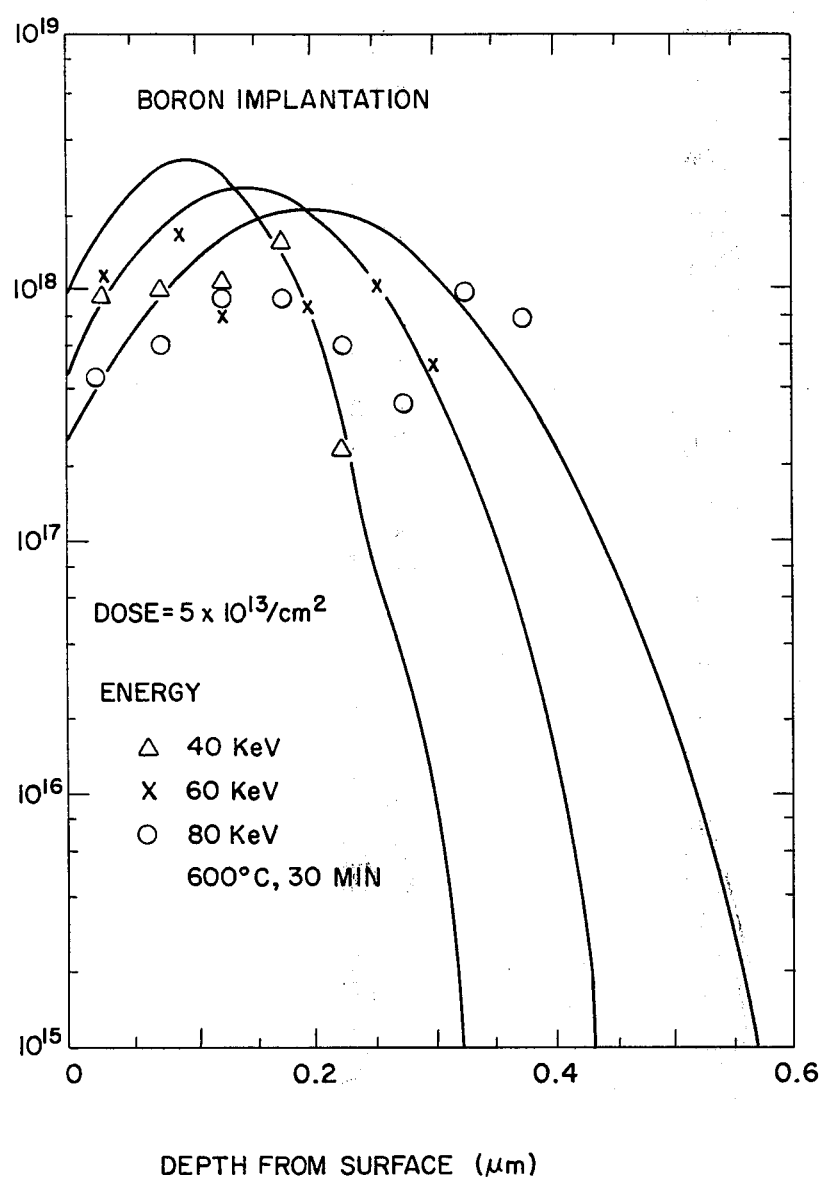
FIG. 1 is a graphic illustration of the relationship between carrier concentration and the distance from the surface of the germanium substrate where ions of boron are implanted into the substrate and annealed thereafter.
Figure 2:
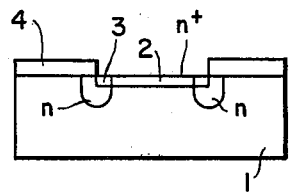
FIGS. 2 and 3 are cross-sectional views of germanium photodiodes made by the known art.

A known germanium photodiode is illustrated in FIG. 2 in cross-section. An n+-type layer 2 is formed by diffusion of impurities such as arsenic of high concentration into an extrinsic p-type germanium substrate 1, then n-type guard ring regions 3 are formed as shown by diffusion of antimony of arsenic according to a conventional technique. The surface of the germanium substrate 1 is covered by a film 4 of silicon dioxide (SiO$_2$) except the part of n+-type layer 2. If a photodiode is made of this germanium substrate, diffusion current caused by diffusion of minority carriers generated within the bulk of the substrate toward the depletion region at the p-n junction is larger than that appearing in any pn-junction silicon photodiode. Dark current is caused mainly by such diffusion current at room temperature. Also the germanium photodiode was known as having an inherent weakness in that the dark current generated therein is substantial. Moreover, in the known photodiode shown in FIG. 2, an n-type inversion layer is created on the surface of p-type germanium substrate 1 which is in contact with the SiO$_2$ layer 4 due to the effect of a positive electric charge within layer 4. Because of this, the depletion region at the p-n junction extends horizontally along the inversion layer, which increases the equivalent contact area and consequently the diffusion current and the leakage current at the surface. In spite of these, no effective step to prevent formation of the inversion layer has been taken because as explained previously it was believed there was no way to form a sufficiently deep layer of p-type impurities in the bulk of germanium substrate at low temperature.

Figure 3:
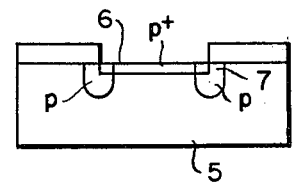

FIG. 3 shows in cross-section another germanium photodiode made according to the known art. A p+-type layer 6 is formed on the surface of an extrinsic n-type germanium substrate 5 by implanting ions of boron or indium therein, and zinc is diffused thereafer into the bulk by heat treatment to form p-type guard ring regions 7 as shown according to a conventional technique. In this case, diffusion of zinc is done by heat treatment at a temperature higher than 800° C., and this affects germanium crystal adversely, tending to increase dark current as described before. In addition, since the diffusion coefficient of zinc is relatively low, the radius of curvature on any section of each guard ring region is small, resulting in a concentration of electric field. Further, since the impurity concentration of zinc is relatively high, the depletion region extends mainly in the lateral direction of the n-type germanium substrate 5 which results in low breakdown voltage. As is generally known, it is desirable to make the effective depletion region as deep as possible in order to maximize the quantum efficiency.

In the present invention, the problems experienced in the prior art were taken into consideration, and a novel method of manufacturing a semiconductor substrate is offered wherein deep lying p-type layers are formed in a germanium substrate at low temperature, thereby maintaining dark current at a level while improving the breakdown voltage characteristics.

As has been outlined previously, the method of the invention is characterized by the fact that p-type impurity layers are formed by implanting ions of beryllium into a germanium substrate, and by such a method, p-type channel stopper regions are formed in a p-type germanium substrate, an p-type guard ring layers are formed in an n-type germanium substrate. Thus, a germanium photodiode which is especially suitable for a detector in a 1 $\mu$m band light communication system can be manufactured by the invention.

Figure 4A:
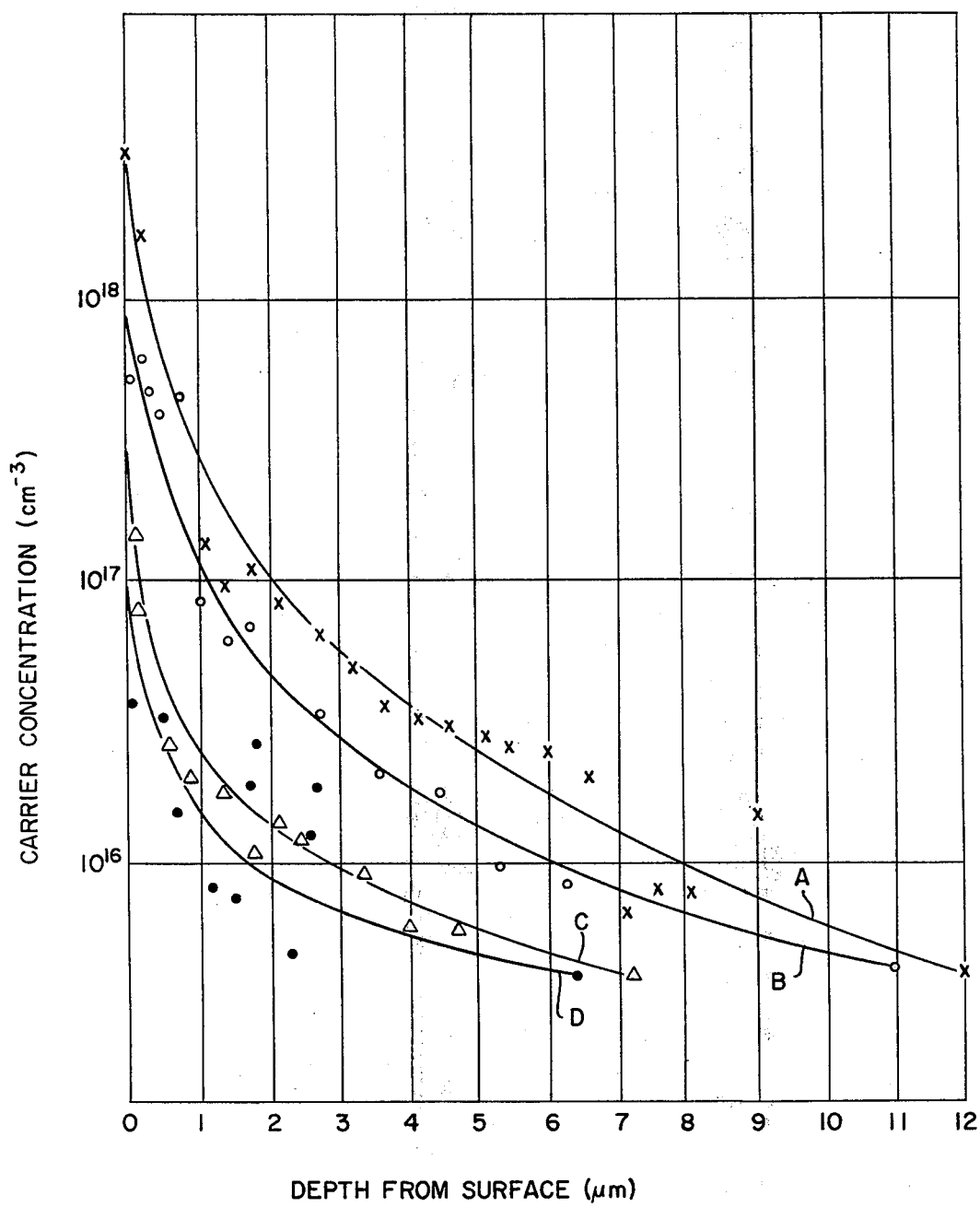
FIGS. 4A, and 4B show the graphs similar to that of FIG. 1 with regard to Be and Zn.

The inventors implanted ions of various impurity materials into germanium substrates, examined the results thereof and found the relationship between the concentration of carriers due to ion implantation of beryllium and the distance from the surface of germanium substrate as shown graphically in FIG. 4A. Curves A and B show the relationship where an applied acceleration voltage is 100 KeV, with doses in the order of $5\times10^{14}$ cm$^{-2}$ (curve A) and $2\times10^{14}$ cm$^{-2}$ (curve B) respectively. Curves C and D illustrate the relationship where an applied acceleration voltage is 50 KeV with doses in the range of $1\times10^{14}$ cm$^{-2}$ (curve C) and $5\times10^-$cm$^{-2}$ (curve D) respectively. (At room temperature, the concentration of carriers may be approximated to the concentration of impurities although the former shows a value only slightly less than the latter value). Concentration of impurities in the germanium substrate was $4\times10^{15}$ cm$^{-3}$ throughout, and heat treatment at 646° C. was carried out for one hour. Examination of the carrier concentration appearing in FIG. 4A reveals that, in the case of curve A, there is a high concentration of carriers due to beryllium exceeding the value of $10^{18}$ cm$^{-3}$ near the surface, and the concentration decreases abruptly in the direction of depth of the substrate, and thereafter the region of low concentration extends approximately 12 $\mu$m deep. Other curves B, C and D exhibit substantially the same type of concentration distribution. The result clearly shows that the concentration of active atoms of beryllium for providing conductive carriers in germanium is more than $10^{18}$ cm$^{-3}$, a value higher than the maximum solid solubility of $4\times10^{16}$ cm$^{-3}$ given in the above-cited publication.

Figure 4B:
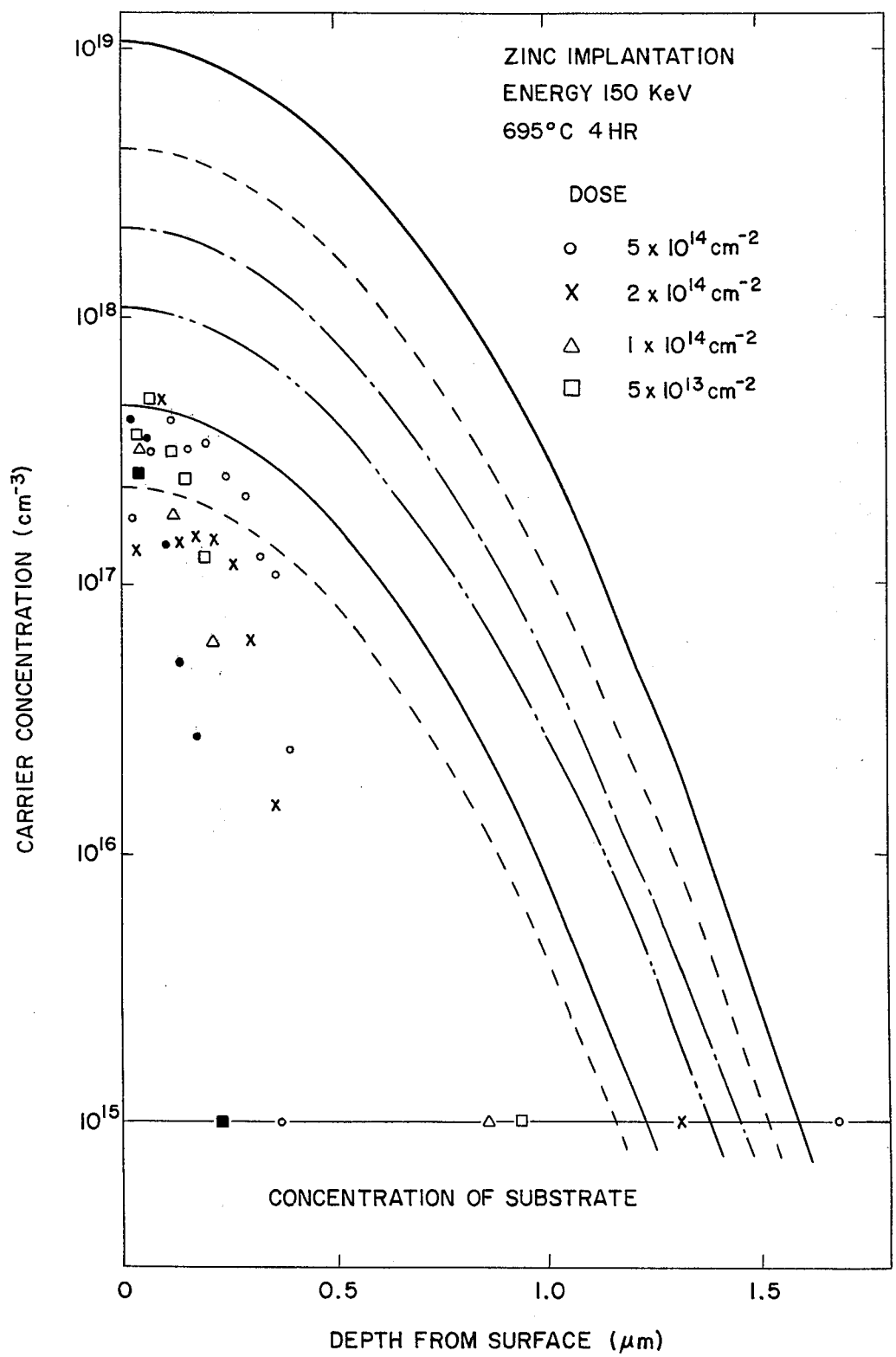

In contrast, where ions of arsenic (As) were implanted into a germanium substrate, with the acceleration voltage 150 KeV, the dose in the range of $5\times10^{13}$ cm$^{-2}$, and with subsequent heat treatment at 692° C. for one (1) hour, carrier concentration at the surface of the substrate was approximately $10^{17}$ cm$^{-3}$ and the diffusion depth was approximately in the order of 2 $\mu$m. Ions of zinc (Zn) were also implanted into a germanium substrate with the acceleration voltage of 150 KeV, the dose in the range of $5\times10^{13}$ cm$^{-2}$, and followed by heat treatment at 695° C. for four (4) hours. Carrier concentration at the surface was approximately $10^{18}$ cm$^{-3}$ and diffusion depth was in the range of 1.5 $\mu$m as illustrated in FIG. 4B.

This data shows that implantation of ions of beryllium into the bulk of germanium substrate allows at low temperature the formation of p-type layers in which the profile concentration at the surface is high and the layer of low concentration extends relatively deeply compared to examples of diffusion by heat treatment of arsenic or antimony (Sb) or examples of ion implantation of arsenic or zinc. According to the method of the invention, p-type layers can be formed at temperatures less than 700° C., so that an increase of dark current due to adverse effect on the crystal structure of the germanium substrate caused by the heat treatment can be prevented.

Figure 5A:
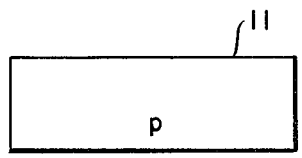
FIGS. 5A to 5F show in cross-section the process of carrying out the method of manufacturing a germanium photodiode according to the present invention.
Figure 5B:
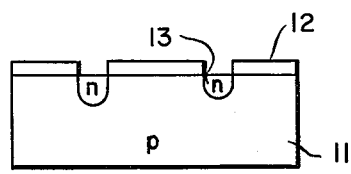
Figure 5C:
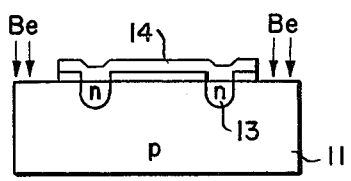
Figure 5D:
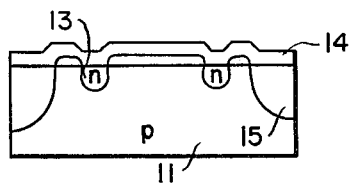

FIGS. 5A to 5F show in cross-section the steps necessary to carry out a method of manufacturing a germanium photodiode as embodied by the present invention. A film 12 of silicon dioxide (SiO$_2$) for a diffusion mask is formed in a conventional manner on the surface of an extrinsic p-type germanium substrate 11 (FIG. 5A). Windows in the oxide film 12 are opened by a known photoetching technology, and antimony is selectively diffused into the substrate through the windows for 2$\frac{1}{2}$ hours at 750° C. to form n-type guard ring regions 13 (FIG. 5B). The entire surface is next covered by an oxide film 14 by a known art, and windows are formed over (as seen in the drawing) the guard ring regions 13. Then, ions of beryllium are implanted into the substrate 11, at an acceleration voltage 100 KeV, with a dose in the range of $2\times10^{14}$ cm$^{-2}$ in a conventional manner (FIG. 5C). In this implantation step, the oxide film masks them to selected regions of the surface to selectively introduce the ions. The substrate is heat treated for one (1) hour at 646° C. to cause activation and diffusion of the implanted beryllium atoms to form p-type channel stopper regions 15 (FIG. 5D). As will be understood from the distribution of carriers due to diffusion of impurity material illustrated in FIG. 4A, beryllium is diffused in such a manner that it is heavily concentrated, in the order of approximately $10^{18}$ cm$^{-3}$, at or near the surface. In the case of an n-type germanium substrate having a concentration in the order of $10^{16}$ cm$^{-3}$, a resultant p-n junction at a depth of approximately 6 $\mu$m from the surface was obtained.

Figure 5E:
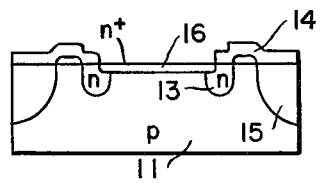
Figure 5F:
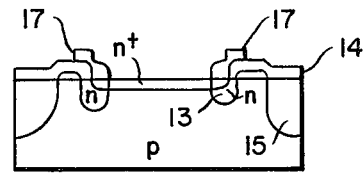

Thereafter, oxide film enclosed by the guard ring regions 13 (as seen in the drawing) is removed, arsenic is selectively diffused for 18 minutes at 620° C. to form a heavily doped n+-type layer 16 of a 3,000–4,000 Å thickness (FIG. 5E). The surface of n+-type layer 16 is where light is to be irradiated and it works as an active region. Then, an aluminum (Al) electrode 17 is deposited by evaporation on the surface of guard ring region 13 (FIG. 5F). By way of explanation, it should be pointed out that guard ring region 13 is prepared in order to increase the breakdown voltage at the periphery of n+-type layer 16. An electrode for the p-type germanium substrate 11 is made by a bonding gold-plated stem to the bottom of the substrate opposite to the layer 16. The electrode is not shown in the drawing.

A germanium photodiode manufactured in the manner described includes a p-type germanium substrate 11 on which is formed an n+-type layer 16, with channel stopper regions 15 formed by the implantation of ions of beryllium, preferably having a diffusion depth of 5 $\mu$m or more, or at least a depth larger than that of the n+-type layer 16.

In the germanium photodiode in accordance with the above embodiment, the p-type carrier concentration due to beryllium is high where the channel stopper regions 15 are in contact with the oxide film 14. Thus, an n-type inversion layer cannot be formed. Because of this, the depletion region does not extend horizontally, this lessens diffusion current and surface leakage current. Further, since p-type channel stopper regions extend deep from the substrate surface, there is an increase of a region which is more heavily doped than p-type germanium substrate 11. In the heavily doped region, diffusion current due to minority carriers, in this case electrons, decreases, so that diffusion current in the p-type germanium substrate can be held down by p-type channel stopper regions 15. In prior art photodiodes devoid of the channel stopper regions, dark current in the order of $10^{-6}$A was generated, while dark current in the photodiode manufactured according to this invention was lowered to approximately $10^{-7}$A, which allows lowering of the minimum level of photo sensitivity of the photodiode device.

FIG. 5G illustrates the technical advantage described above. Curves B show the dark current-voltage relationship in a known device shown on the upper part of the drawing which has an As-diffused layer of 100 μm diameter. Curves A show the same relationship in a device of the same dimensions according to the present invention will. These curves will illustrate the difference of between dark currents in the known device and in the device embodying the present invention.

In the manufacturing steps shown in FIGS. 5A to 5F, heat treatment of the implanted beryllium (FIG. 5D) and formation of an n+-type layer 16 by diffusion and heat treatment of arsenic (FIG. 5E) may be simultaneously carried out.

Another embodiment of the present invention is described referring to FIGS. 6A to 6F.

Figure 6A:
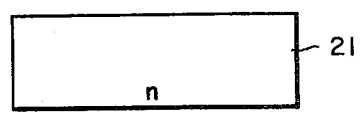
FIGS. 6A to 6F and FIGS. 7A to 7G are views, similar to FIGS. 5A to 5F, showing further embodiments of the method of manufacturing a germanium photodiode according to the invention.
Figure 6B:
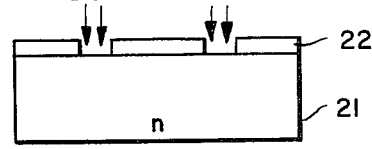
Figure 6C:
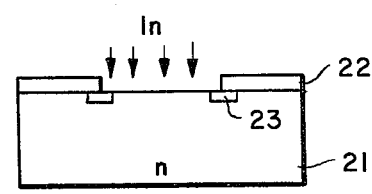
Figure 6D:
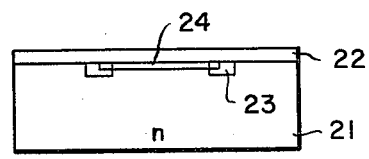
Figure 6E:
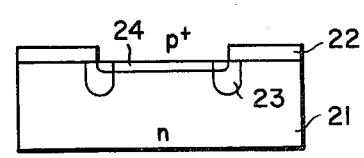
Figure 6F:
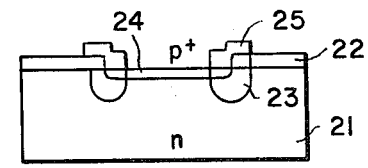

A film 22 of silicon dioxide is formed to cover the surface of an extrinsic n-type germanium substrate 21 (FIG. 6A). Windows are next opened through the oxide film 22 by a conventional photo-etching technology to prepare a mask for implantation of ions of beryllium at an acceleration voltage of 50 KeV, with a dose in the order of $1 \times 10^{14}$ cm$^{-2}$ (FIG. 6B) to form p-type guard ring regions 23. A window is further formed through the oxide film 22 after the implantation process in a known manner to prepare another mask for implantation of ions of indium (In) at an acceleration voltage of 90 KeV, with a dose in the range of $2 \times 10^{-}$cm$^{-2}$ (FIG. 6C) to form a p+-type layer 24 (FIG. 6D). After this second implantation process, the entire surface is covered with oxide film 22, and heat treatment at 646° C. is carried out for one (1) hour to form p-type guard ring regions 23 approximately 6 μm deep. Simultaneously p+-type layer 24 is heavily doped in the order of $10^{18}$ cm$^{-3}$, at 1000 Å A thickness. Next, the oxide film on the surface of p+-type layer 24 is removed according to a conventional art (FIG. 6E) to make a window for receiving incident light. Aluminum is deposited by evaporation and selectively etched off in a known manner to remain on the surface of the peripheral portion of the p+-type region 24 to form an electrode 25 (FIG. 6F).

A germanium photodiode device manufactured as described thus includes an n-type germanium substrate 21 formed with a p+-type layer 24 and p-type guard ring regions 23.

In a germanium photodiode device according to the above embodiment, p-type guard ring regions 23 can be formed 5 μm or more, deep so that the radius of curvature on a section thereof can be made large. Thus, the breakdown voltage thereat is increased to a large extent. In addition, the carrier concentration of p-type guard ring regions 23 is relatively low, $10^{16}$ cm$^{-3}$ near the p-n junction between it and the n-type substrate. Because of these conditions, the depletion region extends in the direction of p-type guard ring region 23 and along the depth of the n-type germanium substrate 21. By virtue of this, breakdown voltage is remarkably increased. Further, since the n-type germanium substrate is formed with p-type guard ring regions and a p+-type layer, the noise level can be lowered compared to a device where p-type germanium substrate is used.

Another embodiment of the invention is characterized by the fact that an island region of the second conductivity type (either n or p) is formed in a germanium substrate of the first conductivity type (either p or n). The island and a region which is heavily doped with impurity material of the same conductivity type as the substrate, and which functions as a region to absorb incident light, form a p-n junction therebetween to make a photodiode. Steps to manufacture a photodiode in accordance with such embodiment are described referring to FIGS. 7A to 7G.

Figure 7A:
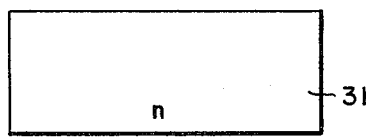
Figure 7E:
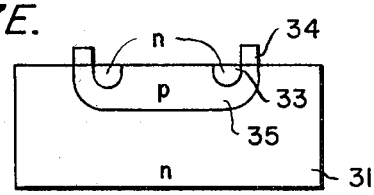
Figure 7B:
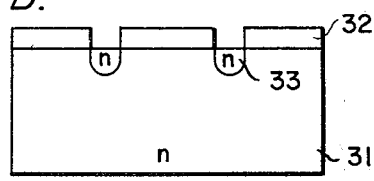
Figure 7F:
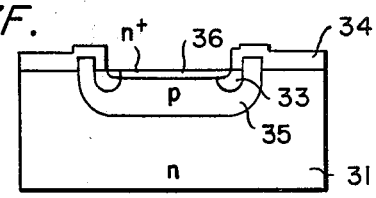
Figure 7C:
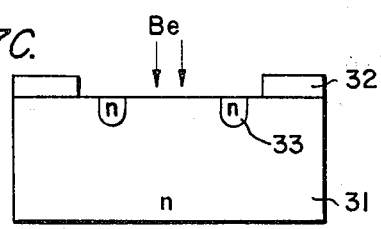
Figure 7G:
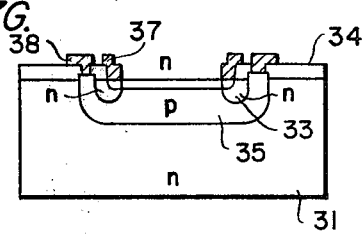
Figure 7D:
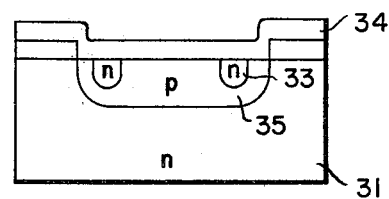

A film 32 of silicon dioxide (SiO$_2$) is caused to cover the surface a of germanium substrate 31 including an n-type germanium bulk having an impurity concentration in the order of $4 \times 10^{15}$ cm$^{-3}$ (FIG. 7A). Windows are opened by conventional photo-etching, and antimony (Sb) is caused to diffuse by heat treatment at 750° C. for 25 hours to form n-type guard ring regions 33 (FIG. 7B). A window is cut through the oxide film 32, ions of beryllium are implanted an at acceleration voltage of 100 KeV, with a dose in the range of $2 \times 10^{14}$ cm$^{-2}$ (FIG. 7C). Thereafter the entire surface is covered with the oxide film 34, and the substrate is heated at 650° C. for one (1) hour for the purpose of activation and diffusion to form a p-type island 35, 12 μm deep and 450 μm in diameter (FIG. 7D). Next, the oxide film on the surface of the island 35 is removed so as to open a window. The oxide film where electrodes are to be formed is not removed in order to lower contact resistance at those points, thus forming protrusions (FIG. 7E). Then the surface of the substrate is etched off by about 1 μm except on an area covered by the oxide film. This process is carried out for the purpose of removing the heavily doped p-type impurity layer formed near the surface of the substrate when ions of beryllium are implanted into the substrate, thereby maintaining the island region 35 lightly doped with impurity material.

Thereafter, the surface of the island region is covered with an oxide film, and the part of the film covering the area surrounded by the guard ring regions 33 is removed so as to open a window. Arsenic (As) is diffused through the window at 620° C. for 18 minutes to form an n+-type layer 36, 3,000–4,000 Å thick (FIG. 7F). After this process, contact windows are formed through the oxide film 34 and then aluminum (Al) is deposited by evaporation so as to form electrodes 37, 38 for the n-type guard ring regions 33 and the p-type island region 35.

A germanium photodiode device thus formed includes an n-type germanium substrate 31 formed with a deep lying lightly doped p-type island region 35 and a heavily doped n+-type layer 36 forming a p-n junction with island region 35 and functioning as the light absorbing surface. The island region has a diameter of 200–500 μm for example, and a depth of 5–15 μm.

In this embodiment, the island region is the functioning layer, so that volume of the bulk is effectively reduced. Dark current can be lowered in the order of $10^{-1}$ or more. This means that a lowering of the minimum level of photo sensitivity is feasible.

Another advantage of this embodiment is that, since the impurity concentration of the island region 35 is low, the depletion region can easily be widened. Because of this, breakdown voltage can be increased. Further, the part of the depletion region which absorbs light is extended, so that quantum efficiency of absorbed light is improved. In addition, a p-type island region is formed at temperatures less than 700° C., so that the crystal structure of the germanium substrate will not be disturbed. This also contributes to the lowering of dark current.

As modifications of this embodiment, an n-type island region may be formed in a p-type germanium substrate by implantation of antimony or arsenic ions. For example, an n-type island region approximately 2 μm deep may be formed in a p-type germanium substrate with an impurity concentration in the order of $10^{15}$ cm$^{-3}$ this is achieved by the implantation of arsenic ions at an acceleration voltage of 150 KeV, with a dose in the range of $5 \times 10^{12}$ cm$^{-2}$. This is followed by heat treatment at 692° C. for one (1) hour. A modification of this embodiment with the conductivity types reversed is illustrated by the steps of FIGS. 7A to 7G.

As has been described, beryllium was selected as a dopant material to be ion-implanted and diffused into the bulk of germanium substrate contrary to the known art.

The step of seeking a dopant material in group II of the periodic table was not attempted in the art from a practical point of view. It is the remarkable discovery by the inventors of the present invention that, despite reported data which would have diverted researchers' attention away from utilizing beryllium as a dopant material to be diffused into the germanium substrate, beryllium can provide a practical p-type layer or region in a germanium bulk only when coupled with the ion implantation technique. It was only after this discovery that p-type layers were formed at temperatures below 700° C. all of which facilitated the lowering of dark current in a p-n function germanium photodiode. Where a p-type germanium substrate is used, it was found that p-type channel stopper regions could be formed, which served the purpose of lowering the dark current. Also, where an n-type germanium substrate was used, it was also found that p-type guard ring regions can be formed to increase breakdown voltage.

It was further found that, by forming an island region in a germanium substrate such that the conductivity types of these are opposite to each other, a p-n junction germanium photodiode was obtained which exhibited low dark current and high breakdown voltage.

Thus, the invenion having been described in its best embodiment and mode of operation, that which is desired to be claimed and protected by Letters Patent is:

1. A method of manufacturing a semiconductor device wherein said method comprises a step of implanting ions of beryllium into a germanium substrate to form a p-type layer in said substrate.

2. A method of claim 1 further including, after implanting said beryllium ions, the step of heating said germanium substrate at a temperature in the range of 400° C. to 700° C. to diffuse said beryllium introduced into said substrate by ion implantation to further form said p-type layer in said substrate.

3. A method of claim 1 further including the step of heating said germanium substrate at a temperature in the range of 400° C. to 700° C. to diffuse said beryllium introduced into said substrate by ion implantation.

4. A method according to claim 1, 2, or 3, wherein an amount of beryllium is introduced into said substrate by ion implantation such that the concentration of beryllium at the surface of said layers of p-type impurity material is $10^{17}$ cm$^{-3}$ to $5 \times 10^{18}$ cm$^{-3}$.

5. A method of manufacturing a semiconductor device comprising the steps of:
   forming a p-type channel stopper region selectively and locally in a p-type germanium substrate by implanting beryllium ions therein; and
   forming an n-type active layer in a region surrounded by, and isolated from, said channel stopper region.

6. A method of manufacturing a semiconductor device comprising the steps of:
   forming a relatively shallow p+-type active layer at one part of an n-type germanium substrate; and
   forming a p-type guard ring region by implanting beryllium ions into said substrate to surround, and partly overlap, said p+-type active layer.

7. A method of manufacturing a semiconductor device comprising the steps of:
   forming a p-type island region at one part of an n-type germanium substrate by implanting beryllium ions into said substrate; and
   forming an n-type region within said p-type region.

8. A method of claim 5, further comprising the step of forming n-type guard ring regions in said p-type germanium substrate by selective diffusion.

9. A method of manufacturing a semiconductor device comprising:
   forming a first silicon dioxide film over a p-type germamium substrate with windows in said first silicon dioxide film to expose part of said p-type substrate;
   selectively diffusing ions of a predetermined element into said p-type germanium substrate through said windows to form n-type guard ring regions;
   forming a second silicon dioxide film to cover said first silicon dioxide film and said p-type germanium substrate, with windows in said second silicon dioxide film to expose part of said p-type germanium substrate;
   implanting ions of beryllium into said p-type germanium substrate through said windows in said second silicon dioxide film;
   heating said p-type germanium substrate to form p-type channel stopper regions by diffusion of said implanted beryllium ions;
   shaping said second silicon dioxide film to form additional windows to expose said p-type germanium substrate and said n-type guard ring regions;
   selectively diffusing ions of a predetermined element into said p-type germanium substrate and said n-type guard ring regions to form a heavily doped n+-type layer;
   forming an aluminum electrode on the surface of said n-type guard ring regions; and
   placing a second electrode in said p-type germanium substrate.

10. A method of manufacturing a semiconductor device comprising the steps of:
    forming a first silicon dioxide film over the surface of an n-type germanium substrate with windows in said first silicon dioxide film to expose part of said n-type germanium substrate;

implanting ions of beryllium through said windows so as to form p-type guard ring regions;

forming an additional window between said windows in said first silicon dioxide film to expose portions of said p-type guard ring regions and the area of said n-type germanium substrate enclosed by said p-type guard ring regions;

implanting ions of a predetermined element into said p-type guard ring regions and said n-type germanium substrate through said additional window to form a p+-type active layer enclosed by said p-type guard ring regions and overlapping said guard ring regions;

forming a second silicon dioxide film to cover said first silicon dioxide film and said p-type germanium substrate;

heating said n-type germanium substrate to further form both said p-type guard ring regions and said p+-type active layer enclosed by said p-type guard ring regions and overlapping said p-type guard ring regions;

selectively removing said second silicon dioxide film to expose said p+-type active layer; and forming aluminum electrodes over said p-type guard ring regions.

11. A method of manufacturing a semiconductor device comprising the steps of:

forming a first silicon dioxide film over an n-type germanium substrate with windows in said first silicon dioxide film to expose part of said n-type germanium substrate;

diffusing ions of a predetermined element into said n-type germanium substrate through said windows so as to form n-type guard ring regions;

forming an additional window in said silicon dioxide film to expose said n-type germanium substrate enclosed by said n-type guard ring regions;

implanting ions of beryllium into said n-type germanium substrate through said additional window to form a p-type island region in the part of said n-type germanium substrate enclosed by said n-type guard ring regions and a part of said n-type germanium substrate not enclosed by said n-type guard ring regions;

forming a second silicon dioxide film to cover said n-type germanium substrate and said first silicon dioxide film;

heating said n-type germanium substrate to further form said n-type guard ring regions and said p-type island region;

shaping said second silicon dioxide film to form protrusions over said n-type guard ring regions, with windows to expose said n-type germanium substrate and said p-type island region where said protrusions are not located;

removing a thin portion of all surface area which is not covered by said second silicon dioxide layer so as to eliminate any material with excess impurities;

forming a third silicon dioxide film to cover said second silicon dioxide film and said n-type germanium substrate, with a window to expose said p-type island region and a part of said n-type guard ring regions;

diffusing ions of a selected element into said p-type island region and said exposed portion of said n-type guard ring regions to form an n+-type layer enclosed by said n-type guard ring regions and partially overlapping said p-type guard ring regions;

shaping said third silicon dioxide film to form contact windows over said n-type guard ring regions and over that part of said p-type island region which is not enclosed by said n-type guard ring regions; and forming aluminum electrodes over said n-type guard ring regions and that part of said p-type island region which is not enclosed by said p-type guard ring regions.

12. A method of claim 9, wherein the beryllium ion implantation is executed at an acceleration voltage of 100 KeV with a dose in the range of $2 \times 10^{14}$ cm$^{-2}$, and heat treated for one hour at 646° C. so that the carrier concentration at or near the surface of said semiconductor device is in the order of approximately $10^{18}$ cm$^{-3}$.

13. A method of claim 10, wherein:

the beryllium ion implantation is executed at an acceleration voltage of 50 KeV with a dose in the order of $10^{14}$ cm$^{-2}$;

implantation of indium ions is executed at an acceleration voltage of 90 KeV, with a dose in the range of $2 \times 10^{13}$ cm$^{-2}$;

the entire surface is covered with said oxide film; and heating is performed at 646° C. for one hour so as to form said p-type guard ring regions at a depth of 6 micrometers, and so as to form said p+-type layer with a thickness of 1,000 Å and a concentration in the order of approximately $10^{18}$ cm$^{-3}$.

14. A method as in claim 11 wherein:

beryllium ion implantation is executed at an acceleration voltage of 100 KeV with a dose in the range of $2 \times 10^{14}$ cm$^{-2}$; and heating is performed at 650° C. for one hour so as to form a p-type island approximately 12 micrometers in depth and 450 micrometers in diameter.

* * * * *

UNITED STATES PATENT AND TRADEMARK OFFICE
CERTIFICATE OF CORRECTION

PATENT NO. : 4,415,370

DATED : November 15, 1983

INVENTOR(S) : Shuzo Kagawa et al.

It is certified that error appears in the above-identified patent and that said Letters Patent is hereby corrected as shown below:

Front Page, insert --[30] Foreign Application Priority Data
    September 28, 1979  Japan  ....... 125047/79
    September 28, 1979  Japan  ....... 125048/79--;

Front Page, [56] OTHER PUBLICATIONS, "Axman" should be --Axmann--; "Bjorkquist" should be --Bjorkqvist--;

Front Page, [57] Abstract, line 4, "There after" should be --Thereafter--.

Column 1, line 8, delete "of" (second occurrence).

Column 2, line 8, "p=type" should be --p-type--.

Column 3, line 18, before "temperature" insert --low--.

Column 5, line 8, after "a" insert --low--;

Column 5, line 15, "an" should be --and--;

Column 5, line 32, "5x10-" should be --$5x10^{13}$--.

Column 6, line 30, "the ions." should be --them to selected regions of the surface.--;

Column 6, line 54, "a bonding" should be --bonding a--.

Column 7, line 1, "horizontally," should be --horizontally.--;

Column 7, line 2, "this" should be --This--;

Column 7, line 23, delete "will" (both occurrences);

Column 7, line 44, "2x10-" should be --$2x10^{13}$--;

Column 7, line 51, delete "A";

Column 7, line 65, "more, deep" should be --more deep,--.

Column 8, line 4, "region" should be --regions--;

UNITED STATES PATENT AND TRADEMARK OFFICE
CERTIFICATE OF CORRECTION

PATENT NO. : 4,415,370

DATED : November 15, 1983

INVENTOR(S) : Shuzo Kagawa et al.

It is certified that error appears in the above-identified patent and that said Letters Patent is hereby corrected as shown below:

Column 8, line 24, "a of" should be --of a--.

Column 9, line 20, "$cm^{-3}$ this" should be --$cm^{-3}$. This--;

Column 9, line 42, after "700 C." insert --,--;

Column 9, line 44, "function" should be --junction--.

Signed and Sealed this

Twenty-fifth Day of December 1984

[SEAL]

Attest:

Attesting Officer

GERALD J. MOSSINGHOFF

Commissioner of Patents and Trademarks